United States Patent [19]

Ishikawa et al.

[11] Patent Number: 5,585,649

[45] Date of Patent: Dec. 17, 1996

[54] COMPOUND SEMICONDUCTOR DEVICES AND METHODS OF MAKING COMPOUND SEMICONDUCTOR DEVICES

[75] Inventors: Masayuki Ishikawa, Kanagawa-ken; Yukie Nishikawa, Chiba-ken; Masaaki Onomura, Tokyo; Shinji Saito, Kanagawa-ken; Peter J. Parbrook, Kanagawa-ken; Genichi Hatakoshi, Kanagawa-ken, all of Japan

[73] Assignee: Kabushiki Kaisha Toshiba, Kanagawa-ken, Japan

[21] Appl. No.: 404,287

[22] Filed: Mar. 14, 1995

[30] Foreign Application Priority Data

Mar. 15, 1994 [JP] Japan .................................. 6-044453

[51] Int. Cl.$^6$ .................................................. H01L 33/00
[52] U.S. Cl. .................................. 257/94; 257/95; 257/96
[58] Field of Search ............................. 257/94, 95, 96, 257/15

[56] References Cited

U.S. PATENT DOCUMENTS

| | | | |
|---|---|---|---|
| 5,010,376 | 4/1991 | Nishimara et al. | 257/94 |
| 5,027,169 | 6/1991 | Takahashi et al. | 257/96 |
| 5,281,830 | 1/1994 | Ketaki et al. | 257/94 |
| 5,306,924 | 4/1994 | Usami et al. | 257/15 |

OTHER PUBLICATIONS

"Room Temperature Continuous Operation of Blue–Green Laser Diodes", N. Nakayama et al., Electronics Letters, 29(16):1488–1489 (1993).

Primary Examiner—Stephen Meier
Attorney, Agent, or Firm—Finnegan, Henderson, Farabow, Garrett & Dunner, L.L.P.

[57] ABSTRACT

A compound semiconductor device with an improved internal current blocking structure. The semiconductor device includes an n-clad layer of II-VI compound semiconductor, a p-clad layer of II-VI compound semiconductor, an active layer of II-VI compound semiconductor between the n-clad and p-clad layers, a very thin current blocking layer of n-type II-VI compound semiconductor on the p-clad layer and providing an opening, a p-contact layer of p-type II-VI compound semiconductor on the p-clad layer and the current blocking layer at the opening, and a p-side electrode on the p-contact layer.

19 Claims, 6 Drawing Sheets

COMPOUND SEMICONDUCTOR DEVICES AND METHODS OF MAKING COMPOUND SEMICONDUCTOR DEVICES

BACKGROUND OF THE INVENTION

The present invention relates to compound semiconductor devices, e.g., a light emitting diode or a semiconductor laser, and methods of making compound semiconductor devices.

II-VI compound semiconductor devices are expected to be light emitting devices which can emit short wavelength light, e.g., green or blue.

Electronics Letters, vol.29, No.16, pp. 1488–1489 (1993) discloses a semiconductor laser composed of a II-VI compound semiconductor. An n-clad layer of n-ZnMgSeS, an n-waveguide layer of n-ZnSe, a multi-quantum well (MQW) layer of CdZnSe, a p-waveguide layer of p-ZnSe, a p-clad layer of p-ZnMgSe, a p-contact layer of p-ZnSeS and a mesa-shaped p-contact layer of p-ZnSe are formed on a substrate of n-GaAs, sequentially.

An insulator layer is formed on the p-contact layer of p-ZnSeS so that the insulator layer and the mesa-shaped p-contact layer cover the p-contact layer of p-ZnSeS. Thus, the laser includes an external current blocking structure between the semiconductor device and the external electrode. A p-side electrode of Pd/Pt/Au is formed on the p-contact layer of p-ZnSe, and an n-side electrode of In is formed on the substrate.

In II-VI compound semiconductor devices, it has been difficult to obtain good ohmic contact. Therefore, the laser in he above-mentioned article requires a high voltage to emit light, e.g., more than 10 V, which is higher relative to the energy of emitted light, e.g., about 2.5 V.

Further, the external current blocking structure causes poor heat radiation efficiency and poor current injection efficiency, since the area where the p-side electrode contacts with the mesa-shaped p-contact layer is small. However, it is difficult to obtain an internal current blocking structure.

As a result, a temperature of the laser is up during operation and the reliability is deteriorated. Therefore, continuous operation and high reliability have not been obtained in II-VI compound semiconductor devices, yet.

Concerning III-V compound semiconductor devices containing nitrogen (N), Appl. Phys. Lett., vol.48 (1986) pp. 207–208 discloses a semiconductor laser having an internal current blocking structure. However, nitrogen containing ("N-containing") III-V compound semiconductor devices have the same problems as II-VI compound semiconductor devices. Jap. Appl. Phys., vol. 32 (1993) pp.L8–L11 discloses N-containing III-V compound semiconductor devices, i.e., pn junction type light emission diode having a double hetero junction and no current blocking structure. The effective current blocking structure for GaN devices has not been obtained. Therefore, current injection type lasers of GaN, i.e., N-containing III-V compound semiconductor devices, are difficult to produce.

SUMMARY OF THE INVENTION

Accordingly, an object of the present invention is to provide II-VI compound semiconductor devices or N-containing III-V compound semiconductor devices including an internal current blocking structure.

Another object of the present invention is to provide II-VI compound semiconductor devices or N-containing compound semiconductor devices including improved ohmic contact.

Another object of the present invention is to provide II-VI compound semiconductor devices having good reliability.

These and other objects of the present invention can be achieved by providing a semiconductor device providing a current blocking structure, comprising: a first semiconductor layer of a first conductive type semiconductor, e.g., p-type; a second semiconductor layer of a second conductive type semiconductor, e.g., n-type, disposed on the first p-type semiconductor layer and partially leaving a surface of the first semiconductor layer expopsed, e.g., providing an opening; and a third semiconductor layer of the first conductive type semiconductor. These layers are composed of one of III-V compound semiconductors comprising nitrogen (N-containing III-V compound semiconductors), e.g., GaN and II-VI compound semiconductors, e.g., CdZnSeS.

According to this device, current from the third semiconductor layer to the first semiconductor layer would be concentrated in the opening of the second semiconductor layer.

The thickness of the second semiconductor layer is preferably about 700 nm or less, more preferably from about 100 nm to about 400 nm.

In this specification, a compound semiconductor, which comprises at least three elements, is represented without ratios, such as ZnCdSeS for $(Zn_{1-x}Cd_x)(Se_{1-a}S_a)$ ($0 \leq x \leq 1$, $0 \leq a \leq 1$).

Compound semiconductors which are used in the present invention include, for example, ZnSe, ZnCdSeS, ZnMgSeS, ZnSeS, ZnTe, ZnTeSe, CdZnSe, CdZnMgSe, CdZnMgTeSe, CdZnMgSeS, GaN, GaInN, GaAlInN, GaInNP, GaAlN, AlGaInPN, or AlGaInAsN.

The second semiconductor layer preferably comprises an n-type semiconductor.

The semiconductor device includes a light emission diode, a semiconductor laser, a hetero junction transistor and the like.

The semiconductor device could be produced by the method comprising the steps of: forming the second semiconductor layer on the first semiconductor layer; partially removing the second semiconductor layer and the surface of the first semiconductor layer so that the opening is formed; forming the third semiconductor layer on the first semiconductor layer and the second semiconductor layer at the opening.

According to the method, the first semiconductor layer would have very few defects at the surface. Therefore, the quality of the first semiconductor layer would be improved. Especially, when the first semiconductor layer is a p-type semiconductor layer, the effect is remarkable. In other words, the p-type semiconductor layer could have a sufficiently high concentration of effective acceptors.

The third semiconductor layer could be replaced by an electrode layer, e.g., a metal layer, so as to make an ohmic contact.

The present invention further provides a semiconductor device comprising: a first semiconductor layer of p-ZnSeS; a second semiconductor layer of p-ZnSe disposed on the first semiconductor layer; a third semiconductor layer of p-ZnSeTe disposed on the second semiconductor layer; a fourth semiconductor layer of p-ZnTe disposed on the third semiconductor layer; and an electrode layer disposed on the fourth semiconductor layer.

This contact structure could make ohmic contact resistance low. Therefore, an operating voltage could be reduced and the reliability would be improved.

In this contact structure, the second, third and fourth semiconductor layers might include a super lattice so that the super lattice comprises a first portion of p-ZnSe layers and p-ZnSeTe layers at a side of the first semiconductor layer, and a second portion of p-ZnSeTe layers and p-ZnTe layers at a side of the electrode layer.

DETAILED DESCRIPTION OF THE PREFERRED EMBODIMENTS

In general, an internal current blocking structure includes two layers of a first conductivity type semiconductor, e.g., a p-type, and one layer, i.e., a current blocking layer, of a second conductivity type semiconductor, e.g., an n-type, between the two layers. The current blocking layer has an opening so that current between the two layers flows through the opening.

The thickness of the current blocking layer is required to be more than about 1 μm in InGaAlP devices. However, in II-VI compound semiconductor devices, when such a large step exists, e.g., 1 μm, the next layer which is formed on the step would have many lattice defects. As a result, the next layer would have high electrical resistance, which causes heat generation in the device. Therefore, an internal current blocking structure has been hard to achieve in II-VI compound semiconductor devices.

However, the inventors of the present invention have discovered that in II-VI compound semiconductor devices, even if a current blocking layer is very thin, e.g., about 200 nm, the thin current blocking layer can sufficiently block current flowing. Further, such a thin current blocking layer would not cause lattice defects to increase so much.

As a result, a II-VI compound semiconductor device having a good internal current blocking structure can be obtained.

As an additional result, an improved II-VI compound semiconductor contact structure can be obtained.

A similar result could be obtained in N-containing III-V compound semiconductor devices.

Embodiments of the present invention will now be described.

EXAMPLE 1

Figure 1:
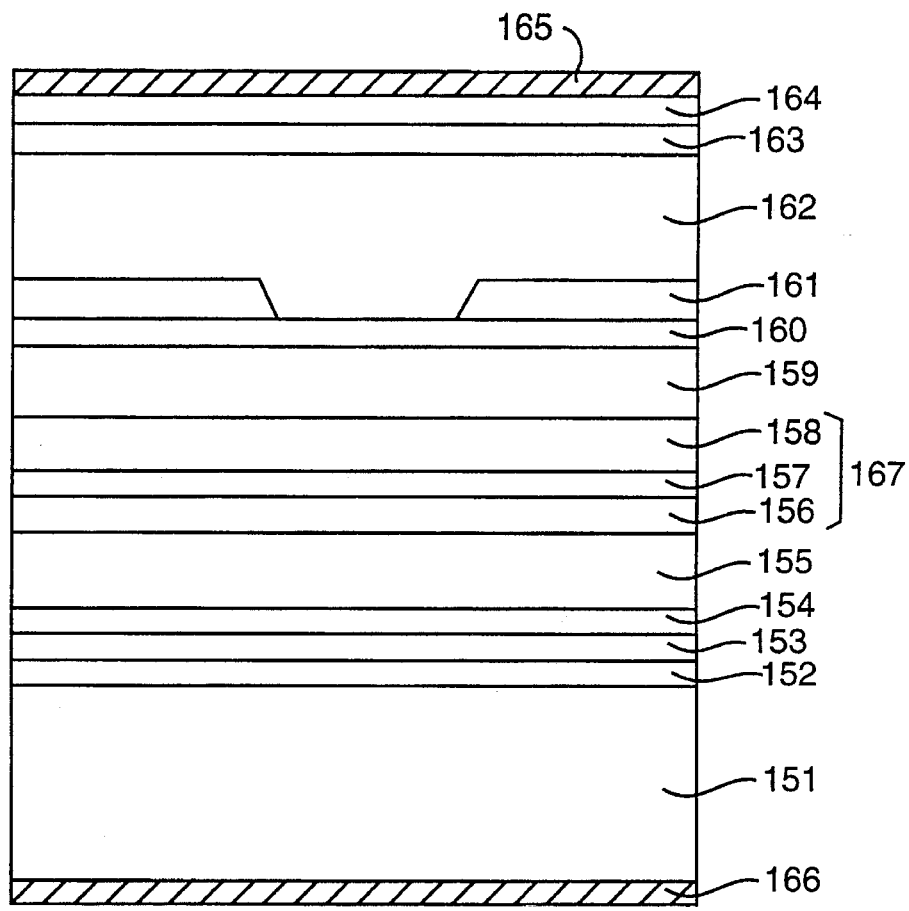
FIG. 1 is a cross-sectional view of a semiconductor laser of one embodiment of the present invention.

FIG. 1 shows a cross-sectional view of a semiconductor laser of an embodiment according to the present invention.

A substrate 151 of n-GaAs is doped with Si at a donor concentration of $3 \times 10^{18} cm^{-3}$. A first buffer layer 152 of n-GaAs doped with Si at a donor concentration of $2 \times 10^{18} cm^{-3}$, has a thickness of 100 nm, and is on substrate 151. A second buffer layer 153 of n-InGaAlP doped with Si at a donor concentration of $1 \times 10^{18} cm^{-3}$ and having a thickness of 100 nm is on first buffer layer 152. A third buffer layer 154 of n-ZnSe doped with Cl at a donor concentration of $1 \times 10^{18} cm^{-3}$ and having a thickness of 10 nm is on second buffer layer 153.

These buffer layers 152, 153, and 154 provide a flat surface with very few defects and make the next layer easy to epitaxially grow. A III-V compound semiconductor including In and P, e.g., InGaAlP, is preferable for a buffer layer, when a III-V compound semiconductor, e.g., GaAs, is used as a substrate for forming a II-VI compound semiconductor layer, e,g, ZnSe, ZnMgSeS, and the like. Therefore, the thicknesses of these buffer layers 152, 153, and 154 are required to be adequate to provide the flat surface with very few defects.

However, when the surface of the substrate 151 is flat without defects and the next layer can be epitaxialy formed, these buffer layers are not necessarily required.

The doping concentration of substrate 151 is preferebly at least about $1 \times 10^{18} cm^{-3}$ for good ohmic contact. The doping concentrations of these buffer layers 152, 153, and 154 are also preferably at least about $5 \times 10^{17} cm^{-3}$ for good ohmic contact.

An n-clad layer 155 of n-ZnMgSeS doped with Cl at a donor concentration of $1 \times 10^{18} cm^{-3}$ and having a thickness of 2 μm is disposed on third buffer layer 154.

A first waveguide layer 156 of ZnMgSeS having a thickness of 100 nm, a quantum well 157 of CdZnSeS (emition wavelength of 520 nm) having a thickness of 10 nm, and a second waveguide layer 158 of ZnMgSeS having a thickness of 100 nm are disposed on n-clad layer 155, sequentially. These layers 156, 157, and 158 comprise an active layer 167 providing a single quantum well.

These wave guide layers 156 and 158 are effective to confine light and carriers in quantum well 157. Therefore, the band-gap energy and the refractivity are larger than that of quantum well 157. Excessive thickness of these waveguide layers 156 and 158 may cause a high order mode of oscillation. Therefore, the thickness of these waveguide layers 156 and 158 is preferably from about 10 nm to about 300 nm.

In quantum well 157, carriers are recombined to emit light. Therefore, the thickness of quantum well 157 is preferably from about 4 nm to about 30 nm.

A p-clad layer 159 of p-ZnMgSeS doped with N at an acceptor concentration of $4 \times 10^{17} cm^{-3}$ and having a thickness of 2 μm, and a p-cap layer 160 of p-ZnSeS doped with N at an acceptor concentration of $1 \times 10^{18} cm^{-3}$ and having a thickness of 100 nm are disposed on second waveguide layer 158, sequentially.

A II-VI compound semiconductor which includes Mg would be easy to oxidize during and after etching of the next layer. Therefore, p-cap layer 160, i.e., a layer of II-VI compound semiconductor which does not include Mg, is effective to protect p-clad layer 159, i.e., a layer of II-VI compound semiconductor which includes Mg, from oxidation. Therefore, the thickness of p-cap layer 160 is preferably from about 5 nm to about 500 nm.

However, when such oxidation does not substantially occur, p-cap layer 160 is not necessarily required.

Carriers are injected through n-clad layer 155 and p-clad layer 159 into active layer 157. Therefore, the concentration of the dopant in n-clad layer 155 is preferably from about $2 \times 10^{17} cm^{-3}$ about $4 \times 10^{18} cm^{-3}$. Also, the concentration of the dopant in p-clad layer 159 is preferably from about $2 \times 10^{17} cm^{-3}$ to about $2 \times 10^{18} cm^{-3}$. The thickness of n-clad layer 155 is preferably from about 500 nm to about 4000 nm. Also, the thickness of p-clad layer 159 is preferably from about 500 nm to about 4000 nm.

A current blocking layer 161 of n-ZnMgSeS doped with Cl at a donor concentration of $2 \times 10^{18} cm^{-3}$ and having a thickness of 200 nm is disposed on p-cap layer 160. Current blocking layer 161 has a stripe opening at its central portion having a width of 7 μm.

The thickness of current blocking layer 161 is preferably about 700 nm or less, and more preferably from about 100 nm to about 450 nm. Excessive thickness would cause the next layer to have many lattice defects.

A buried p-contact layer 162 of p-ZnSeS doped with N at an acceptor concentration of $1 \times 10^{18} cm^{-3}$ and having a thickness of 500 nm is disposed on p-cap layer 160 and current blocking layer 161. The thickness of buried p-contact layer 162 is preferably from about 200 nm to about 5000 nm so as to provide a flat surface.

A super lattice contact layer 163 is disposed on buried p-contact layer 162. Super lattice contact layer 163 includes first layers 163₁ of p-ZnSe doped with N at an acceptor concentration of $1 \times 10^{18} cm^{-3}$, second layers 163₂ of p-ZnSeTe doped with N at an acceptor concentration of $2 \times 10^{18} cm^{-3}$ and third layers 163₃ of p-ZnTe doped with N at an acceptor concentration of $5 \times 10^{18} cm^{-3}$.

A p-contact layer 164 of p-ZnTe doped with N at an acceptor concentration of $5 \times 10^{18} cm^{-3}$, has a thickness of 100 nm, and is on super lattice contact layer 163.

Buried p-contact layer 162, super lattice layer 163, and p-contact layer 164 could be said to comprise a contact layer having a top contact layer of p-contact layer 164. Therefore, the concentration of dopant in these layers 162, 163, and 164 is preferably from about $2 \times 10^{17} cm^{-3}$ to about $2 \times 10^{19} cm^{-3}$.

Figure 2:
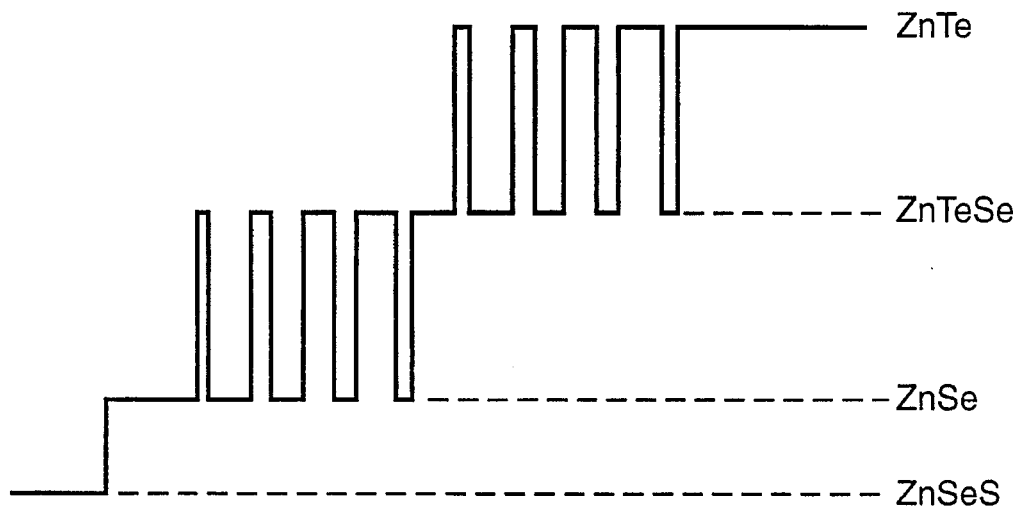
FIG. 2 is a valance band of super lattice contact layer 163 of FIG. 1.

FIG. 2 shows a valance band of super lattice contact layer 163. A part of super lattice layer 163 at the side of buried p-contact layer 162 includes first layers 163₁ and second layers 163₂. First layers 163₁ and second layers 163₂ are sequentially, repeatedly disposed on second buried p-contact layer 162. The thickness of each first layer 163₁ increases from the side of buried p-contact layer 162 to p-contact layer 164. The thickness of each second layer 163₂ decreases from the side of buried p-contact layer 162 to p-contact layer 164.

The other part of super lattice layer 163 at the side of p-contact layer 164 includes second layers 163₂ and third layers 163₃. Second layers 163₂ and third layers 163₃ are sequentially, repeatedly disposed on the part of super lattice layer 163 over buried p-contact layer 162. The thickness of each second layer 163₂ decreases from the side nearest buried p-contact layer 162 to the side nearest p-contact layer 164. The thickness of each third layer 163₃ increases from the side of buried p-contact layer 162 to p-contact layer 164.

For example, Table 1 shows components of super lattice layer 163.

TABLE 1

| layer | thickness (ML:mono atomic layer) |
|---|---|
| (buried p-contact layer 162 side) | |
| first layer 163₁ | ≧5 ML |
| second layer 163₂ | 1 ML |
| first layer 163₁ | 4 ML |
| second layer 163₂ | 2 ML |
| first layer 163₁ | 3 ML |
| second layer 163₂ | 3 ML |
| first layer 163₁ | 2 ML |
| second layer 163₂ | 4 ML |
| first layer 163₁ | 1 ML |
| second layer 163₂ | 5 ML |
| third layer 163₃ | 1 ML |
| second layer 163₂ | 4 ML |
| third layer 163₃ | 2 ML |
| second layer 163₂ | 3 ML |
| third layer 163₃ | 3 ML |
| second layer 163₂ | 2 ML |
| third layer 163₃ | 4 ML |
| second layer 163₂ | 1 ML |
| third layer 163₃ | ≧5 ML |
| (p-contact layer 164 side) | |

A p-side electrode 165 is disposed on p-contact layer 164. The p-side electrode 165 includes a 5 nm Pt layer, a 20 nm Ti layer, a 20 nm Pt layer and a 300 nm Au layer which are disposed on p-side contact layer 164, sequentially.

The Pt layer is effective to obtain good ohmic contact. Therefore, the thickness of the Pt layer is preferably from about 2 nm to about 10 nm.

The Ti layer is effective to prevent Au diffusion into semiconductor so as to obtain good ohmic contact. Therefore, the thickness of the Ti layer is preferably from about 5 nm to about 50 nm. Excessive thickness would cause high electric resistance.

The Au layer is effective to obtain low electric resistance. Therefore, the thickness is preferably at least about 100 nm.

An n-side electrode 166 is disposed on substrate 151. The n-side electrode 166 is composed of a 20 nm Ti layer and a 500 nm Au layer which are disposed on substrate 151, sequentially.

On the n-side electrode 166, the Ti layer is also effective to prevent Au diffusion into the semiconductor so as to obtain good ohmic contact. Therefore, the thickness of the Ti layer is preferably from about 5 nm to about 500 nm. Excessive thickness would cause electric a high resistance. The thickness of Au layer is also preferably at least about 100 nm.

In this embodiment, these semiconductor layers could be produced, e.g., by molecule beam epitaxy (MBE). The metal layers could be formed by electron beam (EB) deposition.

An internal current blocking structure includes first buried p-contact layer 160 of p-ZnSeS, current blocking layer 161 of n-ZnMgSeS disposed on p-cap layer 160, and buried p-contact layer 162 of p-ZnSeS.

After current blocking layer 161 of n-ZnMgSeS is formed, substrate 151 is cooled to room temperature in an MBE chamber for etching of current blocking layer 161. In other words, current blocking layer of n-ZnMgSeS is an upper suface at etching.

Since Se and S, i.e., group II elements in the periodic table, are easy to evaporate, II-VI compound semiconductors, e.g., ZnMgSeS, may have a vacancy of group II elements. The vacancy of group II elements would be donors. The donors would compensate acceptors in p-type semiconductors. Therefore, p-type II-VI compound semiconductors having high effective acceptor concentration have been difficult to obtain.

However, in this embodiment, p-cap layer 160 of p-ZnSeS is cooled with a cap of current blocking layer 161 of n-ZnMgSeS. Therefore, the evaporation of group II elements would occur only in current blocking layer 161 of n-ZnMgSeS. As a result, p-cap layer 160 of p-ZnSeS could have a sufficiently high effective acceptor concentration.

The stripe opening at the central portion of current blocking layer 161 of n-ZnMgSeS was formed by etching, e.g., with a solution of $Br_2$, HBr and $H_2O$. After that, a first surface treatment with HF to remove an insulator layer is performed. After that, a second surface treatment with a mixture solution of $P_2S_5$ and $(NH_4)_2S$, i.e., a sulfide treatment, and a rinse with water were performed, sequentially, to improve the surface of first buried p-contact layer 160 of p-ZnSeS. These treatment are not high temperature treatments. Therefore, since the evaporation of group II elements could be suppressed, the effective accepter concentration could be maintained in p-cap layer 160 of p-ZnSeS.

After drying, e.g, by spinning, buried p-contact layer 162 of p-ZnSeS is formed on p-cap layer 160 and current blocking layer 161 by MBE.

Super lattice contact layer 163 including first layers 163₁ of p-ZnSe, second layers 163₂ of p-ZnSeTe and third layers 163₃ of p-ZnTe makes a hetero barrier between buried p-contact layer 162 of p-ZnSeS and p-contact layer 164 of p-ZnTe small. Therefore, super lattice layer 163 is effective to obtain good ohmic contact. In the other words, a p-ZnSeTe layer between a p-contact layer of p-ZnTe and a buried p-contact layer of p-ZnSer would be effective to improve ohmic contact.

The above-mentioned semiconductor layers 152, 153, 154, 155, 156, 158, 159, 160, 161, and 162 are epitaxially grown on substrate 151 without lattice mismatching. The other semiconductor layers 157, 163, and 164 have some amount of lattice mismatching, however, the thicknesses of these layers are sufficiently thin to avoid the occurrence of lattice defects.

A semiconductor laser having a cavity length of 500 μm was obtained by cleavage. The laser was mounted on a Cu heat sink at the side of p-side electrode 165 with In solder. The properties of the laser were: an oscillation wavelength of 520 nm, an operation voltage of 2.65 V, and a maximum operational temperature in continuous oscillation of 110° C. Further, the laser could operate more than 1000 h at an operation temperature of 70° C. and an emission output of 3 mW.

Figure 3:
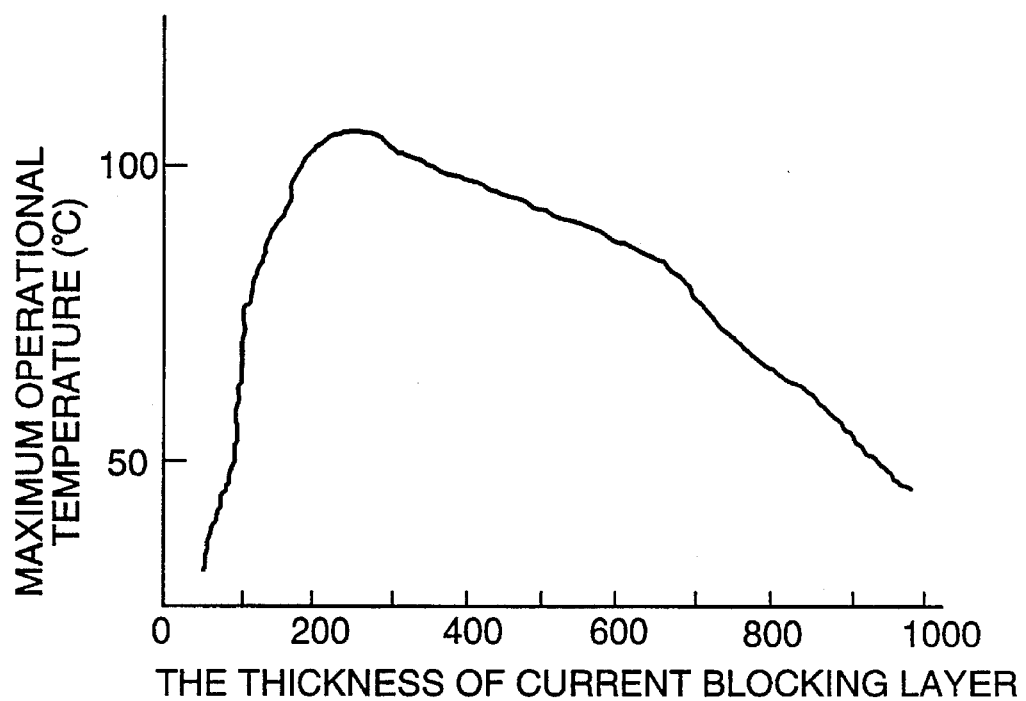
FIG. 3 is a graph showing a relation between the thickness of current blocking layer 161 and the maximum operational temperature of the semiconductor laser shown in FIG. 1.

FIG. 3 shows a relation between the thickness of current blocking layer 161 and the maximum operational temperature. The maximum operational temperature is high at a thickness from about 100 nm to about 700 nm. When current blocking layer 161 is too thin, the current blocking effect is not sufficient. Excessive thickness causes a large step at the opening. As a result, buried p-contact layer 162 would have many lattice defects. Therefore, the thickness of current blocking layer 161 is preferably from about 100 nm to about 700 nm.

Figure 4:
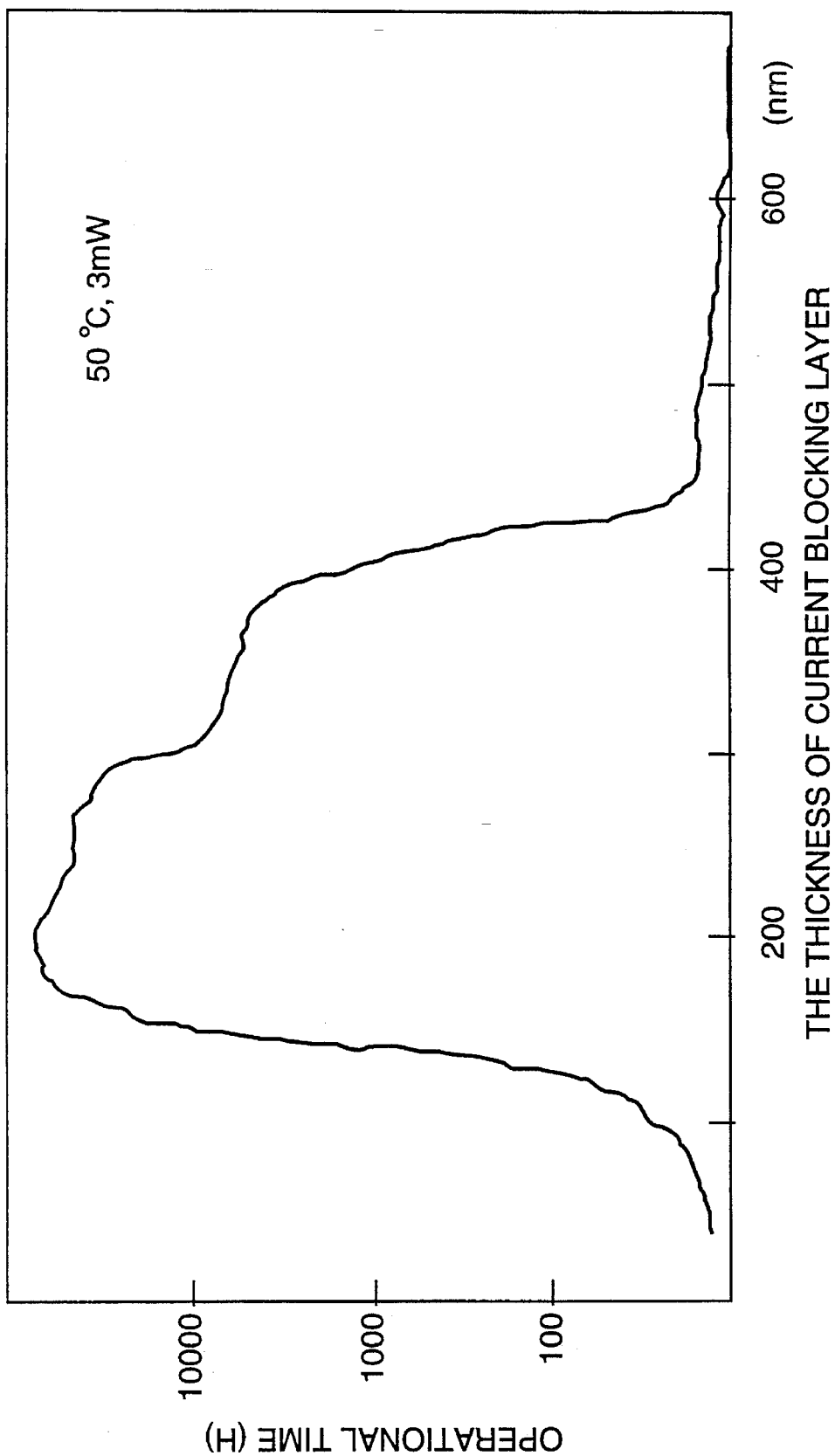
FIG. 4 is a graph showing a relation between the thickness of current blocking layer 161 and the operational time of the semiconductor laser shown in FIG. 1.

FIG. 4 shows a relation between the thickness of current blocking layer 161 and the operational time, i.e., a lifetime, at an operation temperature of 50¿C and an emission output of 3 mW. The lifetime is high at a thickness from about 100 nm to about 450 nm. Further, at a thickness from about 130 nm to about 400 nm, the lifetime was more than 1000 h.

Therefore, the thickness of current blocking layer 161 is preferably from about 130 nm to 400 nm. The thickness is very much smaller than in GaP semiconductor devices. In other words, in GaP semiconductor devices, sufficient current blocking effect could not be obtained by such a thin current blocking layer 161.

Since this embodiment provides an internal current blocking structure, the area where an electrode contacts with a semiconductor layer, i.e., the area where p-side electrode 165 contacts with p-ohmic contact layer 164, could be large. Therefore, electric resistance at the contact could be small. As a result, an operating voltage would become small.

Further, a semiconductor layer generally has a smaller thermal resistance than an insulator. Therefore, thermal dispersion efficiency would be improved more than with an external current blocking structure.

Figure 5:
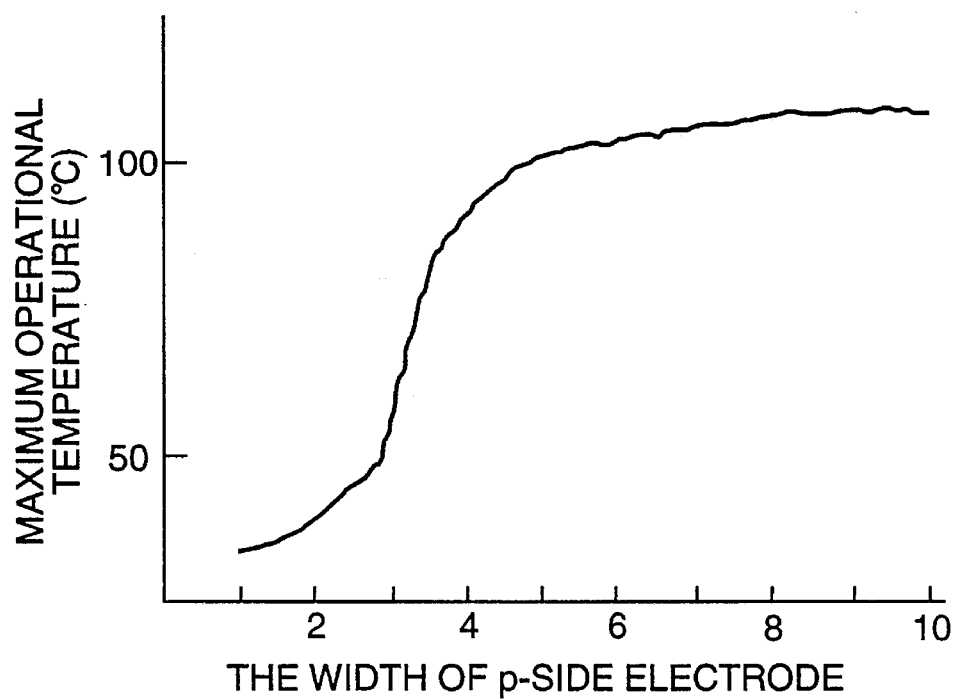
FIG. 5 is a graph showing a relation between the maximum operational temperature and the width of p-side electrode 165 normalized with the width of the opening of current blocking layer 161 of FIG. 1.

FIG. 5 shows a relation between the maximum operational temperature and the width of p-side electrode 165 normalized with the width of the opening of current blocking layer 161. A larger width of p-side electrode 165 increases the maximum operational temperature. When the width of p-side current 161 is three times as large as the opening width or more, the maximum operational temperature extremely increases at the opening width of from about 5 to about 10 um. This relation is not affected by the length of the cavity.

When p-cap layer 160 and buried p-contact layers 162 are replaced by p-ZnSe, the same effect as this embodiment could be obtained.

When current blocking layer 161 is replaced by n-ZnSe, the same effect as this embodiment could be obtained. In such a case, an etching stopper layer, e.g., p-CdZnSe with an etchant of a mixture of $NH_4OH$, $H_2O_2$ and $H_2O$, could be formed on first buried p-contact layer 160.

When good ohmic contact is obtained, super lattice contact layer 163 or p-contact layer 164 might not be required.

P-side electrode 165 could be replaced with Pt/Au, Pd/Ti/Au or Ni/Au. Further these improvements could be obtained in other II-VI compound semiconductors, or the opposite conduction type, i.e., the case that substrate 151 of p-type semiconductor is used.

EXAMPLE 2

Figure 6:
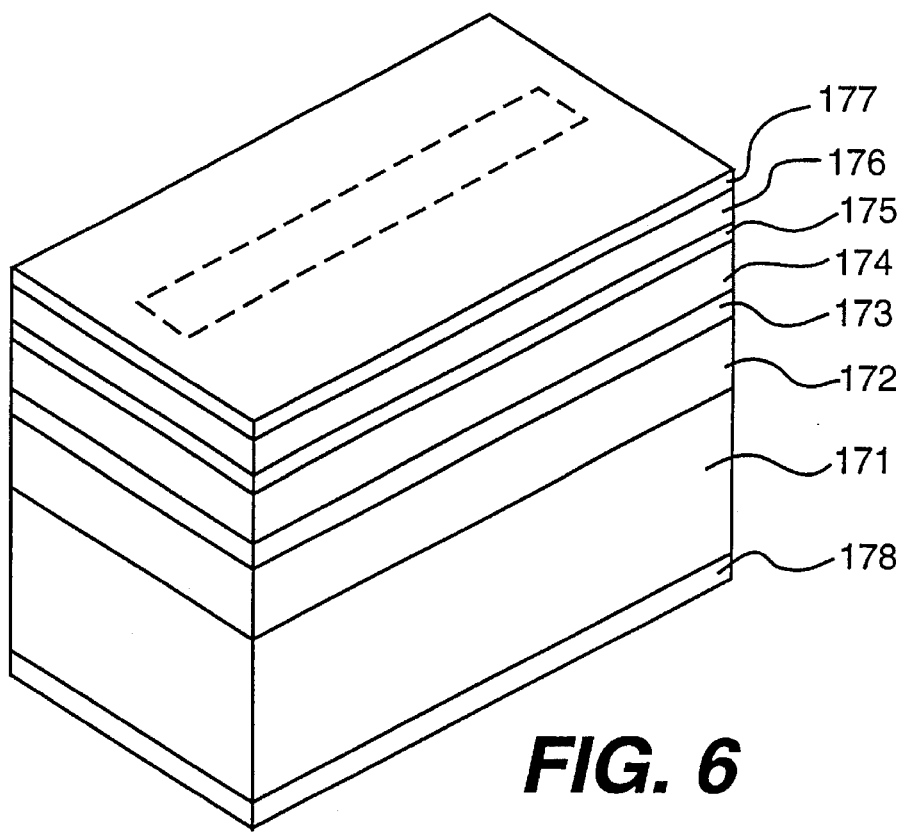
FIG. 6 is a perspective view of a semiconductor laser of another embodiment of the present invention.
Figure 7:
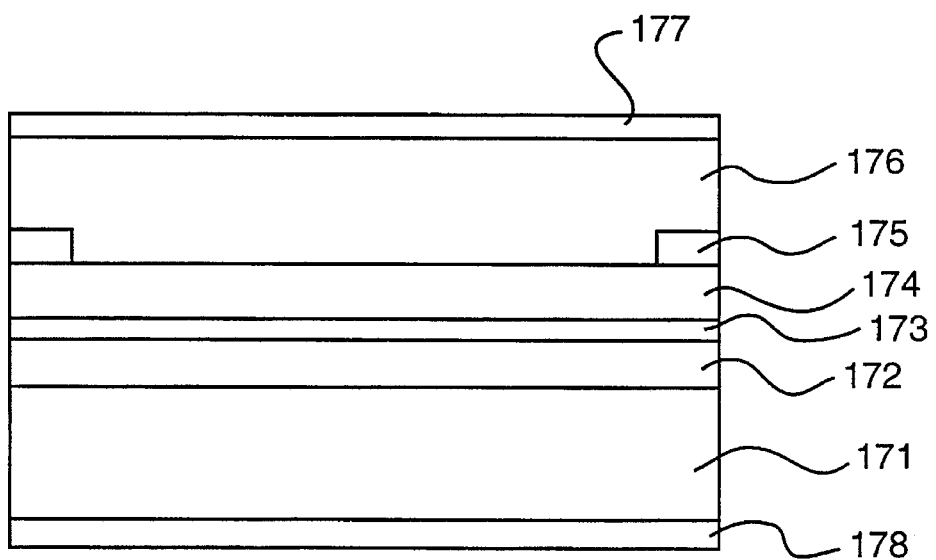
FIG. 7 is a cross-sectional view of the semiconductor laser shown in FIG. 6.

Example 2 is a semiconductor laser which is another embodiment of the present invention, and a variation from Example 1. FIG. 6 shows a perspective view of the semiconductor laser of Example 2, and FIG. 7 shows a cross-sectional view of the semiconductor laser of Example 2.

The structure of Example 2 is substantially the same as Example 1. On a substrate 171 of n-GaAs, an n-clad layer 172 of n-ZnMgSeS, an active layer 173 of multi-quantum wells including wells of CdZnSe and barriers of ZnSeS, a p-clad layer 174 of p-ZnMgSeS, a current blocking layer 175 of n-ZnSe, a p-contact layer 176 of p-ZnSe, and a p-side electrode 177 are sequentially disposed. An n-side electrode 178 is disposed on substrate 171.

In Example 2, current blocking layer 175 is also provided on edges of active layer 173, i.e., cavity edges. Therefore, according to Example 2, current injection to the cavity edges could be prevented so that generation of defects at the edges, which would be often observed in II-VI compound semiconductor lasers, could be suppressed. As a result, the reliability of the laser could be improved.

This current blocking layer structure would be effective in other devices which have an active layer having an exposed edge surface, e.g., light emitting diodes.

EXAMPLE 3

Figure 8:
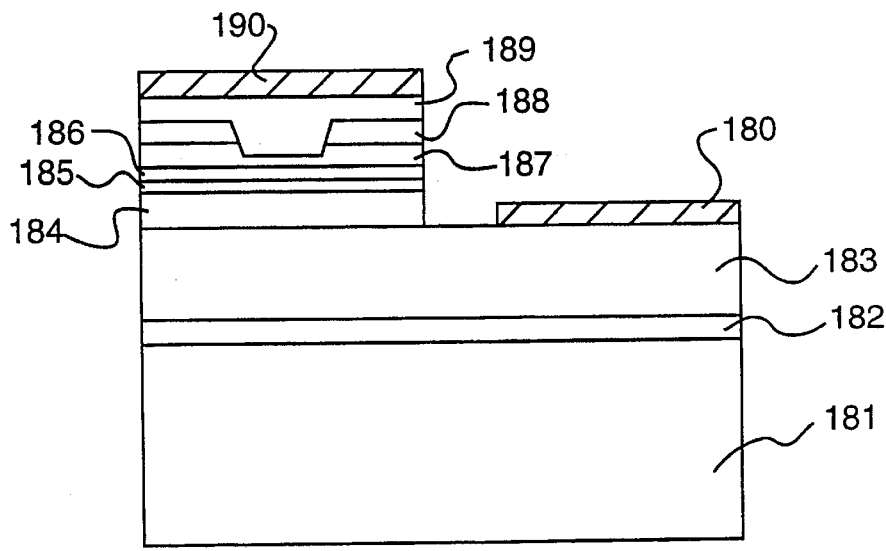
FIG. 8 is a cross-sectional view of a semiconductor laser of another embodiment of the present invention.

The current blocking structure of Example 1 would also be effective for N-containing III-V compound semiconductor devices, e.g., GaN. Example 3 is a semiconductor laser of another embodiment of the present invention. FIG. 8 shows a cross-sectional view of the semiconductor laser of Example 3.

On a substrate 181 of sapphire, a buffer layer 182 of GaN and n-type layer 183 of n-GaN are sequentially disposed. An n-side electrode 180 is disposed on n-type layer 183, which covers a part of n-type layer 183.

An n-clad layer 184 of n-GaAlN, an active layer 185 of InGaN and a p-clad layer 186 of p-GaAlN are disposed on n-type layer 183, sequentially.

A buried p-contact layer 187 of p-GaN and a current blocking layer 188 of n-GaN are sequentially disposed on p-clad layer 186. Current blocking layer 188 provides a stripe opening. Buried p-contact layer 187 provides a shallow hollow corresponding to the opening. This structure could be obtained by etching.

A p-contact layer 189 of p-GaN is disposed on buried p-contact layer 187 and current blocking layer 188 so that the opening is covered with p-contact layer having a flat surface.

A p-side electrode 190 is disposed on p-contact layer 189.

According to Example 3, an operating voltage would become small, and thermal dispersion efficiency would be improved.

EXAMPLE 4

In example 1, the laser providing an inner current blocking structure is disclosed. The structure could be used at a contact between a semiconductor layer and an electrode.

In other words, the current blocking structure in Example 1 provides a p-type layer having a sufficiently high effective acceptor concentration, even if a II-VI compound semiconductor is used.

Figure 9:
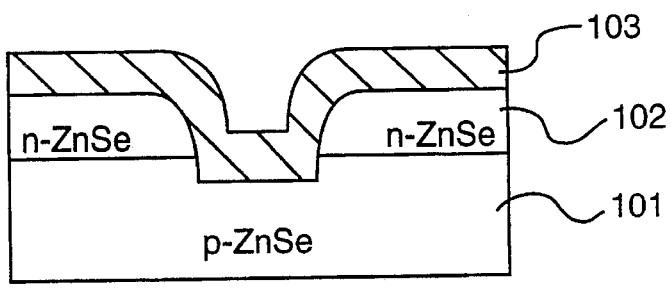
FIG. 9 is a cross-sectional view of a semiconductor device of another embodiment of the present invention.

FIG. 9 shows a contact structure of another embodiment according to the present invention.

An n-type semiconductor layer 102 of n-ZnSe doped with Cl at $2\times10^{18}cm^{-3}$, has a thickness of 200 nm and is on a p-type semiconductor layer 101 of p-ZnSe doped with N at $1\times10^{18}cm^{-3}$. The n-type semiconductor layer 102 provides an opening.

A metal electrode 103 is disposed on p-type semiconductor layer 101 at the opening and covers n-type semiconductor layer 102. Metal electrode 103 includes a Pt layer of 5 nm, a Ti layer of 20 nm, a Pt layer of 20 nm and a Au layer of 300 nm which are sequentially formed on p-type semiconductor layer 101.

The contact structure in FIG. 9 was obtained by MBE. After p-ZnSe was formed on a GaAs substrate by MBE with a dopant of N activated in plasma, n-ZnSe was formed on it by MBE with a dopant of $ZnCl_2$. A temperature of the substrate was about 300¿C. After the substrate was cooled to room temperature, the substrate was taken out of an MBE chamber.

The net acceptor concentration (=$N_A-N_D$, $N_A$; acceptor concentration, $N_D$; donor concentration) was about $1\times10^{18}cm^{-3}$ measured by voltage-capacity method (C-V method). The reason why such high effective acceptor concentration is obtained is the same as Example 1.

Selenium (Se), i.e., a group VI element in the periodic table, is easy to evaporate. However, in this embodiment, p-type semiconductor layer 101 of p-ZnSe is cooled with a cap of n-type semiconductor layer 102 of n-ZnSe. Therefore, the evaporation of Se occurs only in n-type semiconductor layer 102 of n-ZnSe. As a result, p-type semiconductor layer 101 of p-ZnSe could have sufficiently high effective acceptor concentration.

Figure 10:
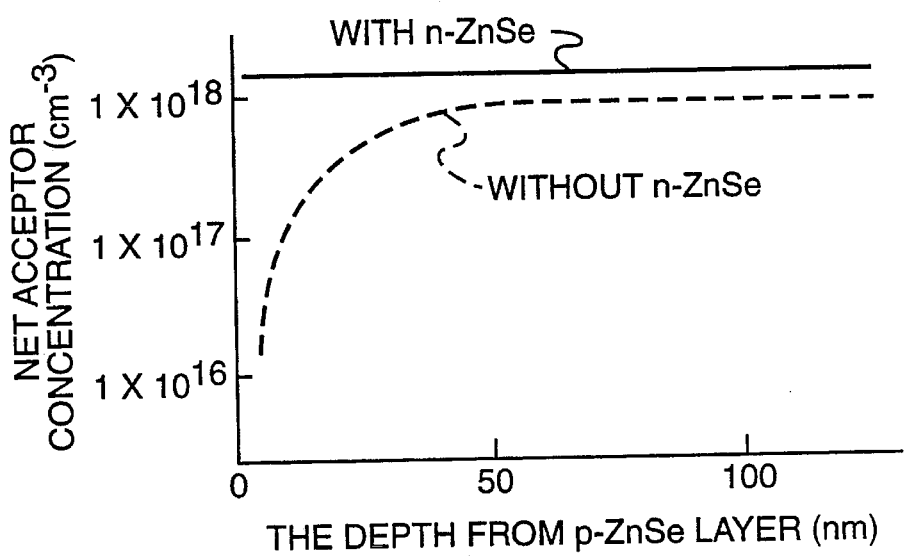
FIG. 10 is a graph showing a relation between the depth from the surface of the p-ZnSe layer 101 of FIG. 9 and the effective acceptor concentration.

FIG. 10 shows net acceptor concentrations. In FIG. 10, a continuous line indicates Example 4 and a broken line indicates a comparative example which does not provide n-type semiconductor layer 102. In the comparative example, the effective acceptor concentration decreased at about 50 nm from the surface of p-type semiconductor layer 101. Therefore, the thickness of n-type semiconductor layer is preferably about 50 nm or more.

After the opening in semiconductor layer 102 was formed by etching with a solution of $Br_2$, HBr and $H_2O$, the Pt layer, the Ti layer, the Pt layer and the Au layer were sequentially formed on p-type semiconductor layer 101 so as to comprise metal electrode 103 by EB deposition. A substrate temperature was maintained at 150° C. or less so as to suppress Se evaporation.

When the opening was formed, p-type semiconductor layer 101 was also etched so that a shallow hollow or a depression was formed on the surface of p-type semiconductor layer 101. As a result, if p-type semiconductor layer 101 has low quality surface, e.g., lattice defects or low effective acceptor concentration, p-type semiconductor layer 101 could have high quality surface. Further, since the area of contact between p-type semiconductor layer 101 and metal electrode 103 was enlarged because of the hollow, the electric resistance at the contact could be reduced.

After that, an anneal was performed at a temperature of about 400¿C for about 10 seconds so that Pt entered into p-type semiconductor layer 101.

In this embodiment, the electric resistance at the contact was about $1\times10^{-4}\Omega\cdot cm^2$ or less.

Further, the thickness of the Pt layer between the p-type semiconductor layer and the Ti layer is preferably about 10 nm or less. Excessive thickness of the Pt layer would cause the effective acceptor concentration to decrease. The thickness of the Ti layer is preferably from about 2 nm to about 10 nm.

EXAMPLE 5

Figure 11:
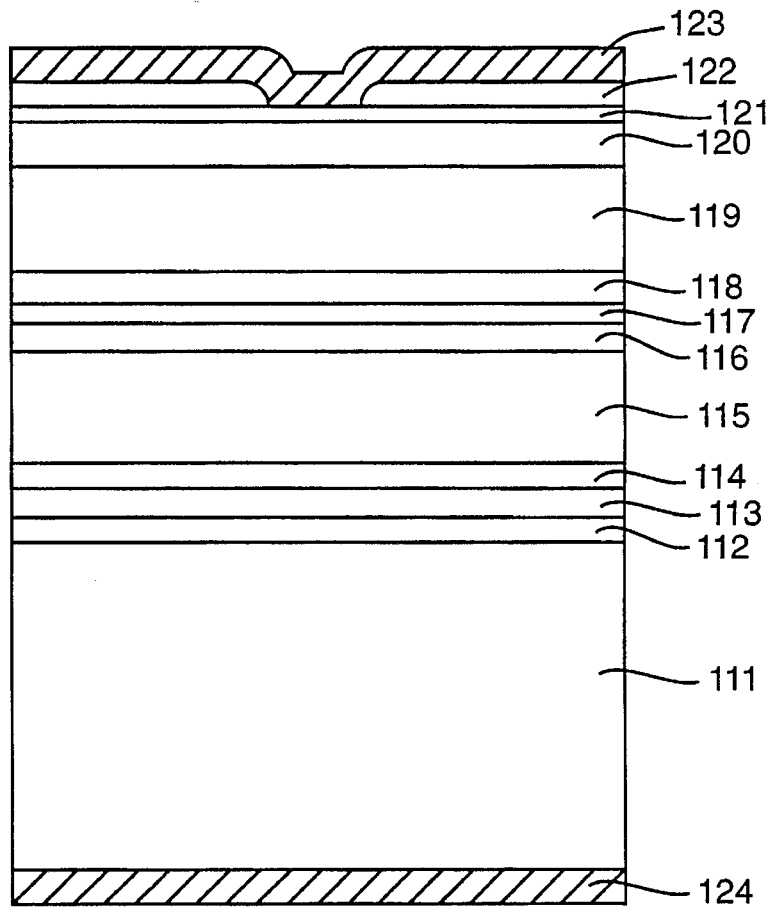
FIG. 11 is a cross-sectional view of a semiconductor laser of another embodiment of the present invention.

Example 5 is a semiconductor laser of another embodiment according to the present invention and providing the same structure as Example 4 at a p-side electrode. The other structure of this embodiment is substantially the same as Example 1. FIG. 11 shows a cross-sectional view of a semiconductor laser of Example 5.

A substrate 111(151) of n-GaAs, a first buffer layer 112(152) of n-GaAs, a second buffer layer 113(153) of n-InGaAlP, a third buffer layer 114(154) of n-ZnSe, an n-clad layer 115(155) of n-ZnMgSeS, a first waveguide layer 116(156) of ZnMgSeS, an active layer 117(157) of CdZnSeS, a second waveguide layer 118(158) of ZnMgSeS, and a p-clad layer 119(159) of p-ZnMgSeS are the same as Example 1.

A buried contact layer 120 of p-ZnSeS doped with N at an acceptor concentration of $7\times10^{17}\text{cm}^{-3}$, has a thickness of 300 nm and is on p-clad layer 159. A p-contact layer 121 of p-ZnSe doped with N at an acceptor concentration of $1\times10^{18}\text{cm}^{-3}$, has a thickness of 100 nm and is on buried contact layer 120.

A current blocking layer 122 of n-ZnMgSeS doped with Cl at a donor concentration of $2\times10^{18}\text{cm}^{-3}$ and having a thickness of 200 nm is disposed on p-contact layer 121. Current blocking layer 122 has a stripe opening at its central portion having a width of 7 µm.

A p-side electrode 123(165) which is the same as Example 1 is disposed on p-contact layer 121 and current blocking layer 122. An n-side electrode 124(166) which is the same as Example 1 is disposed on substrate 111.

A semiconductor laser having a cavity length of 500 µm was obtained by cleavage. The laser was mounted on a Cu heat sink at the side of p-side electrode 123 with an In solder. The properties of the laser were: an oscillation wavelength of 520 nm, a threshold current for continuous operation of 35 mA, an operation voltage of 5 V, and a maximum operational temperature in continuous oscillation of 70° C. Further, the laser could operate more than 1000 h at an operation temperature of 40° C. and an emission output of 3 mW.

In Example 5, since another epitaxial layer is not formed on current blocking layer 122, current blocking layer 122 is not required to be sufficiently thin like as current blocking layer 161 in Example 1.

EXAMPLE 6

Figure 12:
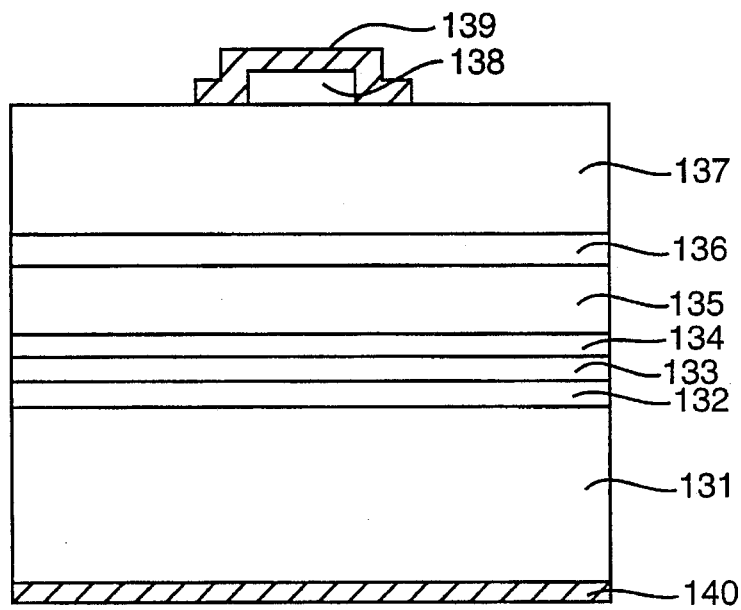
FIG. 12 is a cross-sectional view of a light emission diode of another embodiment of the present invention.

Example 6 is a light emitting diode of another embodiment according to the present invention and providing the same structure of Example 4 at n-side electrode except for opposite conductive type. FIG. 12 shows a cross-sectional view of a light emitting diode of Example 6.

A first buffer layer 132 of p-GaAs doped with Be at an acceptor concentration of $1\times10^{18}\text{cm}^{-3}$ and having a thickness of 100 nm, a second buffer layer 133 of p-InGaAlP doped with Be at an acceptor concentration of $1\times10^{18}\text{cm}^{-3}$ and having a thickness of 100 nm, and a third buffer layer 134 of p-ZnSe doped with N at an acceptor concentration of $1\times10^{18}\text{cm}^{-3}$ and having a thickness of 10 nm are disposed on a substrate 131 of p-GaAs doped with Zn at an acceptor concentration of $5\times10^{18}\text{cm}^{-3}$, sequentially.

A p-clad layer 135 of p-ZnMgSeS doped with N at an acceptor concentration of $4\times10^{17}\text{cm}^{-3}$ and having a thickness of 2 µm, an active layer 136 of a multi-quantum well of CdZnSeS/ZnSeS, and an n-clad layer 137 of n-ZnMgSeS doped with Cl at a donor concentration of $1\times10^{18}\text{cm}^{-3}$ and having a thickness of 2 µm are disposed on third buffer layer 134, sequentially.

Active layer 136 is composed of forty wells of CdZnSeS having a thickness of 6 nm, and barriers of ZnSeS having a thickness 4 nm between neighboring wells. The barriers of ZnSeS are also provided between the top of wells and n-clad layer 137 of n-ZnMgSeS, and between the bottom of wells and p-clad layer 135 of p-ZnMgSeS. The amount of strain in the well is about +1% to GaAs, and the amount of strain in the barrier is about −1.5% to GaAs so that the amount of strain in the whole of active layer 136 is about 0%. Since the thicknesses of the well and the barrier are less than the threshold thickness, active layer 136 did not have lattice defects.

A current blocking layer 138 of p-ZnMgSeS doped with N at an acceptor concentration of $4\times10^{17}\text{cm}^{-3}$ and having a thickness of 200 nm is disposed on n-clad layer 137. Current blocking layer 138 is a circle having a diameter of 150 µm.

An n-side electrode 139 is disposed on current blocking layer 138 and n-clad layer 137. The n-side electrode 139 is composed of a 20 nm Ti layer and a 300 nm Au layer covering the Ti layer. The n-side electrode 139 is also a circle having a diameter of 180 µm, which has a common center of current blocking layer 138. A p-side electrode 140 has the same structure of n-side electrode 139 and disposed on substrate 131.

The above-mentioned semiconductor layers 132, 133, 134, 135, 137, and 138 are epitaxially grown on substrate 131 without lattice mismatching. This embodiment could also be produced by MBE method. For example, current blocking layer 138 of p-ZnMgSeS could be formed by etching with a solution of $Br_2$, HBr and $H_2O$.

A light emission diode having a size of 300 µm×300 µm had the following properties: an emission wavelength of 490 nm, an emission efficiency of 1.5% with a continuous operation current of 20 mA, and an operation voltage of 3 V. Further, the efficiency did not decrease more than 5% from the initial efficiency after 1000 hours of continuous operation with 20 mA of an operation current.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device providing a current blocking structure, comprising:

a first semiconductor layer of a first conductive type of one of II-VI compound semiconductors and N-containing III-V compound semiconductors;

a second semiconductor layer of a second conductive type of one of II-VI compound semiconductors and N-containing III-V compound semiconductors on the first semiconductor layer the second semiconductor layer having an aperture for partially leaving a surface of the first semiconductor layer exposed; and a third layer of the first conductive type semiconductor comprising one of II-VI compound semiconductors and N-containing III-V compound semiconductors on the first semiconductor layer and contacting the second semiconductor layer through the aperture.

2. The semiconductor device according to claim 1, wherein a thickness of the second semiconductor layer is about 700 nm or less.

3. The semiconductor device according to claim 1, wherein a thickness of the second semiconductor layer is from about 100 nm to about 450 nm.

4. The semiconductor device according to claim 1, wherein the first conductive type is p-type and the second conductive type is n-type.

5. The semiconductor device according to claim 1, wherein the first semiconductor layer provides a hollow at a portion covered with the third layer.

6. The semiconductor contact structure according claim 5, wherein the second semiconductor layer has a depression, and the third semiconductor layer contacts the second semiconductor layer at the hollow of the first semiconductor layer.

7. The semiconductor contact structure according to claim 6, wherein the depression and the hollow are coextensive.

8. The semiconductor contact structure according to claim 8, wherein the depression and the hollow are formed in a single etching step.

9. The semiconductor device according to claim 1, wherein the first semiconductor layer comprises the II-VI compound semiconductor, and the second semiconductor layer comprises the II-VI compound semiconductor, and the third layer comprises the II-VI compound semiconductor.

10. A semiconductor laser comprising:

a semiconductor substrate of n-type;

an n-clad layer of II-VI compound semiconductor on the substrate;

an active layer of II-VI compound semiconductor on the n-clad layer;

a p-clad layer of II-VI compound semiconductor on the active layer;

a current blocking layer of n-type II-VI compound semiconductor on the p-clad layer and having an opening;

a buried p-contact layer of p-ZnSeS on the current blocking layer and contacting the p-clad layer through the opening of the current blocking layer;

a p-contact layer of p-ZnTe on the buried p-contact layer;

a first electrode in contact with the p-contact layer; and a second electrode in contact with the semiconductor substrate; and a super lattice comprising ZeSe layers, ZnSeTe layers, and ZnTe layers between the buried p-contact layer and the p-contact layer wherein the super lattice comprises a first portion of p-ZnSe layers and p-ZnSeTe layers at a side of the buried p-contact layer, and a second portion of p-ZnSeTe layers and p-ZnTe layers at a side of the p-contact layer.

11. A semiconductor device comprising:

an n-clad layer of one of II-VI compound semiconductors and N-containing III-V compound semiconductors;

a p-clad layer of one of II-VI compound semiconductors and N-containing III-V compound semiconductors;

an active layer of one of II-VI compound semiconductors and N-containing III-V compound semiconductors between the n-clad and p-clad layers;

a current blocking layer of n-type semiconductor comprising one of II-VI compound semiconductors and N-containing III-V compound semiconductors, disposed on the p-clad layer and providing an opening;

a p-contact layer of p-type semiconductor comprising one of II-VI compound semiconductors and N-containing III-V compound semiconductors on the current blocking layer and contacting the p-clad layer through the opening; and a p-side electrode on the p-contact layer.

12. The semiconductor device according to claim 11, wherein the active layer includes multi-quantum wells.

13. A semiconductor device comprising:

a semiconductor substrate of a first conductive type;

a first clad layer of the first conductive type on the semiconductor substrate;

an active layer of one of II-VI compound semiconductors and N-containing III-V compound semiconductors on the first clad layer;

a second clad layer of a second conductive type on the active layer;

a current blocking layer of the first conductive type on the active layer;

a current blocking layer on the first conductive type on the second clad layer and having an opening;

a contact layer of a semiconductor material of the second conductive type on the current blocking layer and contacting the second clad layer through the opening of the current blocking layer;

a first electrode in contact with the contact layer; and a second electrode in contact with the semiconductor substrate.

14. The semiconductor device according to claim 13, wherein a thickness of the current blocking layer is about 700 nm or less.

15. The semiconductor device according to claim 13, further comprising a cap layer of the second conductive type between the current blocking layer and the second clad layer.

16. The semiconductor device according to claim 15, wherein the second clad layer comprising a Mg-containing II-VI compound semiconductor, and the cap layer comprises a Mg-free II-VI compound semiconductor.

17. The semiconductor device according to claim 13, further comprising a semiconductor buffer layer of the first conductive type semiconductor between the substrate and the first clad layer.

18. The semiconductor device according to claim 13, wherein the contact layer comprises:

a buried contact layer on the second clad layer and the current blocking layer at the opening of the current blocking layer;

a top contact layer on the buried contact layer; and a super lattice layer between the top contact layer and the buried contact layer, comprising first layers of semiconductor comprising the buried contact layer and second layers of another semiconductor comprising the top contact layer.

19. The semiconductor device according to claim 13, wherein the active layer includes multi-quantum wells.

* * * * *

UNITED STATES PATENT AND TRADEMARK OFFICE
CERTIFICATE OF CORRECTION

PATENT NO. : 5,585,649
DATED : December 17, 1996
INVENTOR(S) : Masayuki ISHIKAWA et al.

It is certified that error appears in the above-indentified patent and that said Letters Patent is hereby corrected as shown below:

Claim 1, column 12, line 45, "layer the" should read -- layer, the--.

Claim 8, column 13, lines 5-6, "claim 8" should read --claim 7--.

Signed and Sealed this

Twelfth Day of August, 1997

Attest:

Attesting Officer

BRUCE LEHMAN

Commissioner of Patents and Trademarks